United States Patent
Tsao et al.

(10) Patent No.: US 7,969,708 B2
(45) Date of Patent: Jun. 28, 2011

(54) ALPHA TANTALUM CAPACITOR PLATE

(75) Inventors: Jung-Chih Tsao, Tainan (TW);
Miao-Cheng Liao, Yunlin (TW); Phil Sun, Kaohsiung (TW); Kei-Wei Chen, Taipei (TW)

(73) Assignee: Taiwan Semiconductor Company, Ltd., Hsin-Chu (TW)

( * ) Notice: Subject to any disclaimer, the term of this patent is extended or adjusted under 35 U.S.C. 154(b) by 730 days.

(21) Appl. No.: 11/933,919

(22) Filed: Nov. 1, 2007

(65) Prior Publication Data

US 2009/0116169 A1    May 7, 2009

(51) Int. Cl.
*H01G 4/06* (2006.01)
(52) U.S. Cl. ..... 361/311; 361/312; 361/313; 361/321.1; 361/321.2; 361/301.4
(58) Field of Classification Search .......... 438/685, 438/597, 602–604, 652–653; 361/311, 312–313, 361/321.1, 321.2, 301.4
See application file for complete search history.

(56) References Cited

U.S. PATENT DOCUMENTS

| | | | |
|---|---|---|---|
| 4,364,099 A | | 12/1982 | Koyama et al. |
| 5,783,282 A | * | 7/1998 | Leiphart ................ 428/138 |
| 6,100,545 A | * | 8/2000 | Chiyo et al. ............. 257/98 |
| 6,426,512 B1 | * | 7/2002 | Ito et al. .................. 257/12 |
| 6,812,051 B2 | * | 11/2004 | Usui et al. ............... 438/22 |
| 7,189,588 B2 | * | 3/2007 | Usui et al. ............... 438/22 |
| 7,205,634 B2 | | 4/2007 | Liao et al. |
| 7,253,109 B2 | * | 8/2007 | Ding et al. ............. 438/685 |
| 7,662,488 B2 | * | 2/2010 | Oshima ................ 428/698 |
| 7,674,699 B2 | * | 3/2010 | Shibata ................ 438/602 |

OTHER PUBLICATIONS

Wang, J.H., et al., "Ta and Ta—N diffusion barriers sputtered with various $N_2$/Ar ratios for Cu metalization," JVST B 20(4)—Microelectronics and Nanometer Structures, American Vacuum Society, Jul./Aug. 2002, pp. 1522-1526.

* cited by examiner

*Primary Examiner* — Nguyen T Ha
(74) *Attorney, Agent, or Firm* — Slater & Matsil, L.L.P.

(57) ABSTRACT

A method for forming an alpha-tantalum layer comprising disposing a nitrogen containing base layer on a semiconductor substrate, bombarding the nitrogen containing base layer with a bombarding element, thereby forming an alpha-tantalum seed layer, and sputtering a layer of tantalum on the alpha-tantalum seed layer, thereby forming a surface layer of substantially alpha-tantalum.

20 Claims, 7 Drawing Sheets

TaN

ALPHA TANTALUM CAPACITOR PLATE

TECHNICAL FIELD

The present invention relates generally to semiconductor devices and methods of making, and more particularly to a metal-insulator-metal (MIM) capacitor including an alpha-tantalum plate.

BACKGROUND

Demand for system-on-chip products, where both analog and digital signal processing are implemented, is increasing. For example, analog circuits capture an analog signal from the surrounding environment and transform the signal into bits, which are then transformed into signals for driving digital circuitry and output functions. Increasingly, it is useful to have both the analog circuitry and digital circuitry in close proximity, for example in the form of digital blocks and analog blocks of circuitry which function together to implement the function of the system, also referred to as mixed mode systems. A concern with the integration of analog and digital blocks is electronic mismatch.

Electronic mismatch of circuitry components may result in reduced signal processing quality. Deviations in processing conditions or the physical stability of component structures in processing and operating environments may contribute to electronic mismatch, for example, a capacitance value of a MIM structure may be inconsistent. The capacitance and response of a MIM capacitor may be affected by several variables. These variables may include processing and operating conditions and may adversely affect the thickness of the capacitive dielectric layer and the resistance of the capacitor plates. The manufacture of stable, low resistance MIM structures has been attempted, in order to reliably provide for the desired capacitances.

Figure 1:
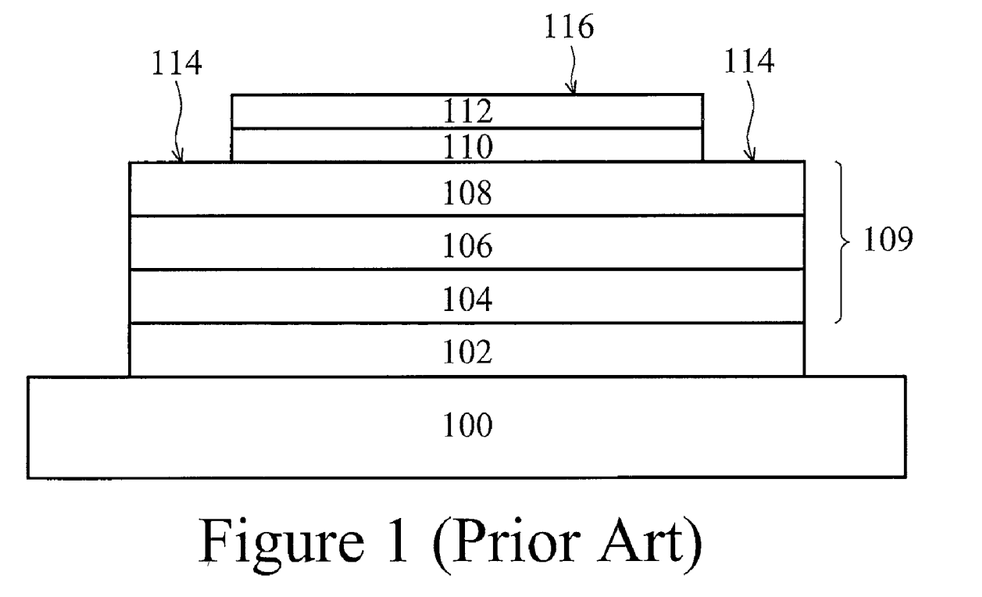
FIG. 1 illustrates a known MIM capacitor structure.

Referring to FIG. 1, a known method of forming a MIM capacitor is illustrated. Layer 102 is a silicon nitride (SiN) layer of about 750 Å. Layer 102 is deposited on substrate 100. First tantalum nitride layer 104, of about 200 Å, is deposited on layer 102. Aluminum-copper layer 106, of about 1200 Å, is disposed on first tantalum nitride layer 104, and second tantalum nitride layer 108 of about 600 Å is disposed on aluminum-copper layer 106, thus forming bottom plate 109 of a MIM capacitor. Dielectric layer 110 is disposed on bottom plate 109. Top plate 112, comprised of tantalum nitride (TaN) of about 500 Å, is deposited as the MIM capacitor top plate. Contact to the bottom plate may be made in bottom contact regions 114, and contact to the top plate may be made in top contact region 116.

One disadvantage of the prior art capacitor system is the thickness of the system. It may be difficult to planarize a thick capacitor system. A further disadvantage of the prior art method is the high resistance of the capacitor plates of about 250 µohm-cm. In addition, the process is complex, and may therefore be expensive to manufacture.

SUMMARY OF THE INVENTION

These and other problems are generally solved or circumvented, and technical advantages are generally achieved, by illustrative embodiments, which relate to a MIM capacitor with an alpha-tantalum plate.

An illustrative embodiment of a metal-insulator-metal (MIM) capacitor includes an alpha-tantalum first plate. The MIM capacitor includes a first plate with a base layer of a nitrogen containing compound, a bombarded sub-layer of the base layer, and a surface layer of substantially alpha-tantalum. The MIM capacitor further includes a dielectric layer disposed on the first plate and a second plate disposed on the dielectric layer.

One advantage of an illustrative embodiment may be to lower the resistance of a capacitor plate. Another advantage of an illustrative embodiment may be a lower profile of the capacitor. A further advantage of an illustrative embodiment is the lower cost of making a lower resistance, lower profile MIM capacitor.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts.

The present invention will be described with respect to illustrative embodiments in a specific context, namely a capacitor structure. The illustrative embodiments may also be applied, however, to other semiconductor devices and structures, for example, the alpha-tantalum layer may be incorporated into a resistor or transistor component of a semiconductor device. The specific embodiments discussed are merely illustrative of specific MIM structures, and do not limit the scope of the invention.

Crystalline phase transitions in tantalum thin films occur in accordance with changes in the nitrogen concentration of the tantalum thin film. When the nitrogen concentration is lower than approximately 2%, the tantalum thin film consists of beta-tantalum (β-Ta). When the nitrogen concentration is in the range of from approximately 8 to less than approximately 11 atomic %, the tantalum thin film consists of alpha-tantalum (α-Ta). Alpha-tantalum may be the more desirable film for an application, because of the lower sheet resistance of α-Ta in comparison to β-Ta.

Figure 2:
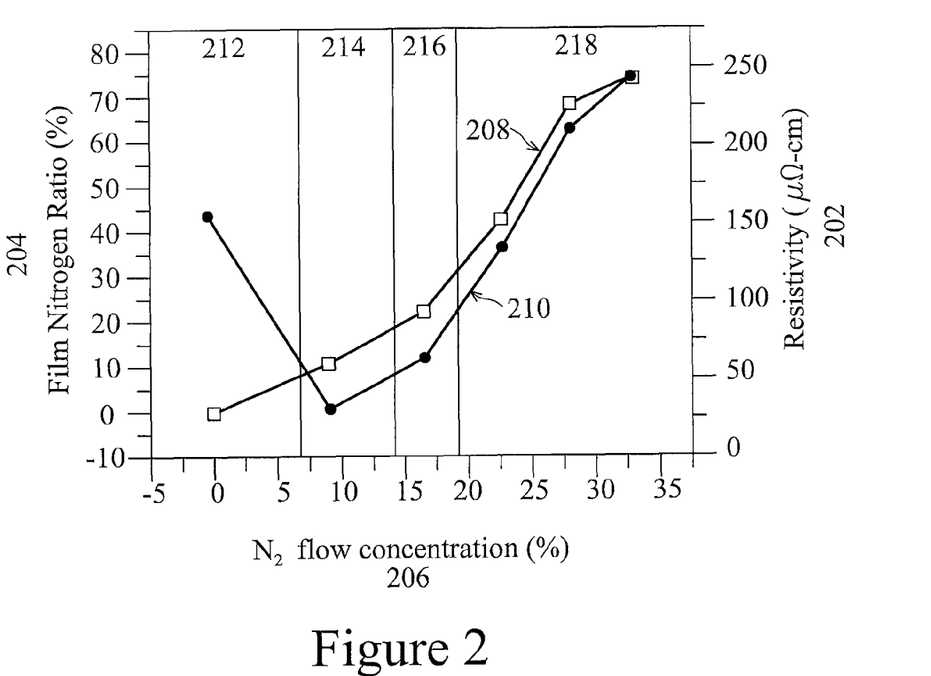
FIG. 2 is a graph of sheet resistance and percent nitrogen incorporated into the tantalum film versus the $N_2$ flow concentration during Ta sputter.

Turning to FIG. 2, a graph is shown illustrating the sheet resistance 202 (μohm-cm) and film nitrogen ratio 204 (%) incorporated into the tantalum layer versus the $N_2$ flow concentration 206 (%). Curve 208 indicates the film nitrogen ratio 204 versus $N_2$ flow concentration 206 in the reactor during the tantalum sputter. Curve 208 shows the $N_2$ flow increasing from 0 to about 35% volume, while the film nitrogen ratio increases from 0 to about 75%. An inert gas such as, for example, argon may comprise the remaining percent gas flow. Curve 210 indicates the sheet resistance 202 of the Ta film as the resistance relates to the $N_2$ flow concentration 206. At zero percent $N_2$ flow, the Ta sheet resistivity is about 150 μohms-cm. Zone 212 denotes a phase zone in which the layer comprises β-Ta. At about 8% $N_2$ flow, the sheet resistance of the Ta layer is at about 30 μohms-cm. Zone 214 denotes the α-Ta phase zone. As can be noted from the graph, the sheet resistance increases with the $N_2$ flow in zones 214, 216, and 218, therefore, the film nitrogen ratio increases. Zone 216 refers to the Ta(N) zone, which has a higher nitrogen content than α-Ta. Finally, Zone 218 refers to the TaN zone, in which Ta and N atoms are in a regularly spaced matrix with a concentration of nitrogen of 30% and higher.

Figure 3A:
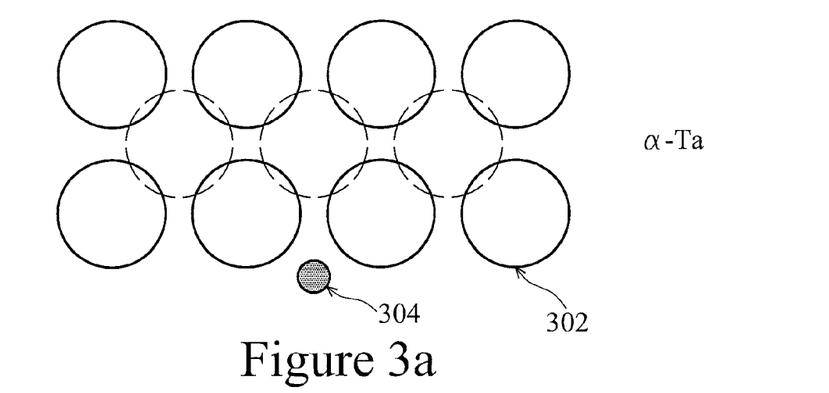
FIGS. 3a, 3b, and 3c illustrate the crystalline phases of alpha-tantalum ($\alpha$-Ta), beta-tantalum ($\beta$-Ta) and Tantalum nitride (TaN) layers, respectively.
Figure 3B:
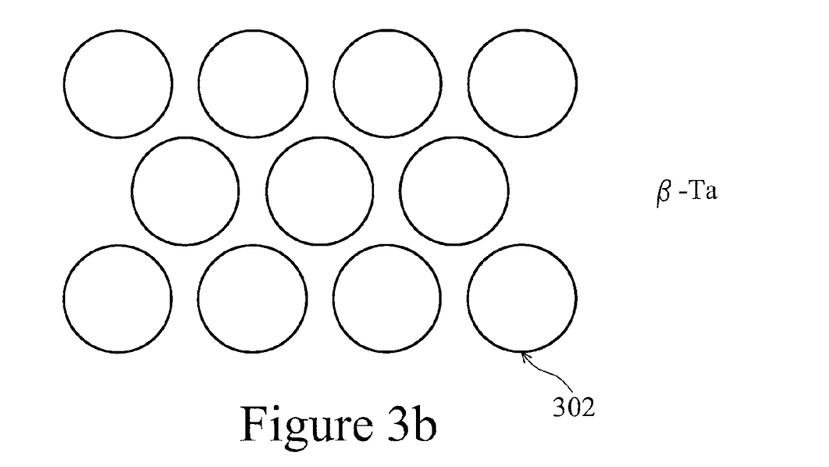
Figure 3C:
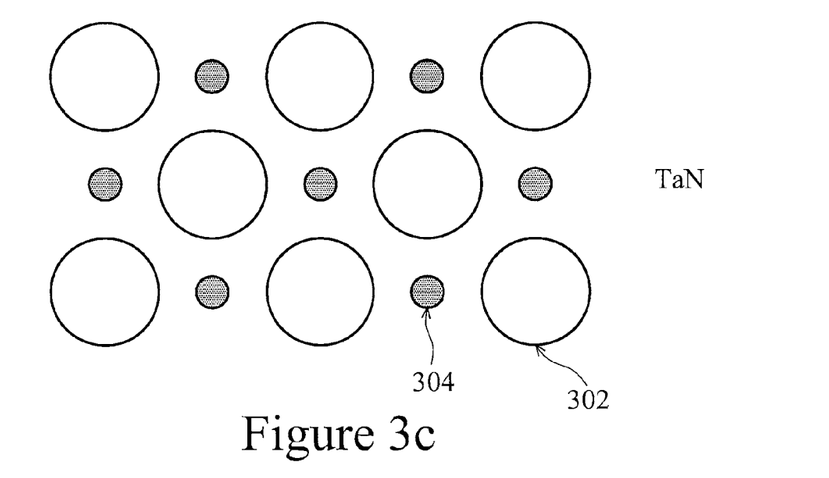

FIGS. 3a, 3b, and 3c illustrate the crystalline phases of alpha-Tantalum (α-Ta), beta-tantalum (β-Ta) and Tantalum nitride (TaN) layers, respectively. FIG. 3a illustrates a layer of α-Ta. The body-centered-cubic crystalline structure of the α-Ta layer is comprised of a plurality of tantalum atoms 302, incorporating around 10% of atomic nitrogen (N) 304. As shown in zone 214 of FIG. 2, α-Ta has a low resistivity of about 20 to 40 μohms-cm.

FIG. 3b illustrates the tetragonal-body-centered structure of β-Ta. Note that the β-Ta has less than 8% N (no nitrogen is illustrated in the figure). As shown in zone 212 of FIG. 2, β-Ta has a higher resistivity of about 160-170 μohms-cm. Due to the lower resistivity of the alpha phase, it may be preferred over the beta phase for electronic applications.

FIG. 3c shows Ta and N atoms in a regularly spaced matrix with a concentration of nitrogen of higher than 30%. The body-centered-cubic structure of α-Ta incorporates N atoms interstitially.

Figure 4:
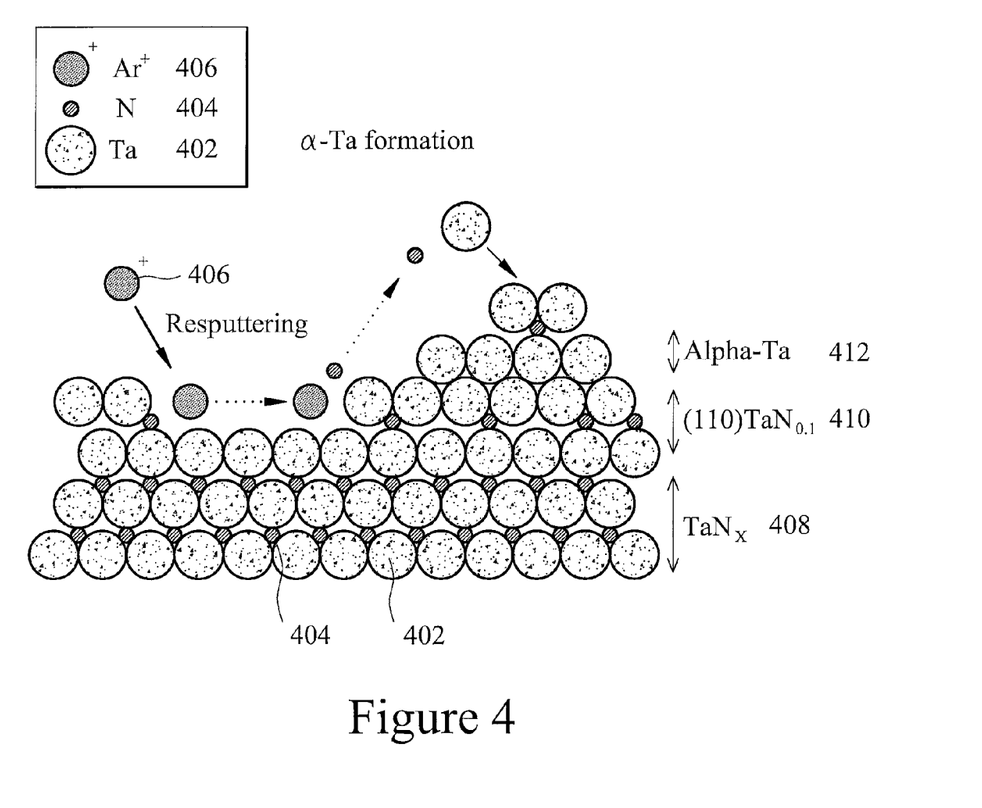
FIG. 4 pictures the formation of an $\alpha$-Ta layer, in accordance with an illustrative embodiment.

FIG. 4 pictures the formation of an α-Ta layer in accordance with an illustrative embodiment. In region 408, Ta atoms 402 and nitrogen atoms 404 are shown in a regularly spaced lattice structure. However, region 408 may be any nitrogen containing compound within the scope of the illustrative embodiments. In region 410, the layer pictured indicates a lower nitrogen concentration of a Ta(N) layer. Region 412 of the layer illustrates an α-Ta layer of a lower nitrogen concentration of about 8% to 10%. No β-Ta is pictured in FIG. 4, however, in practice, there may be some β-Ta incorporated into the Ta film of decreasing nitrogen concentration.

Bombarding element 406 may be any atom, molecule, or compound such as, for example, an argon ion, a krypton atom, or a boron difloride molecule used to impact the nitrogen containing compound in region 408. FIG. 4 pictures the formation of the α-Ta layer by bombarding a TaN layer with bombarding element 406, which, in this example, is an argon ion. As the bombarding element 406 impacts the film surface disturbing the TaN lattice, N and Ta are released from the lattice. The surface of the film re-forms with less nitrogen, forming a layer of Ta(N). As the bombardment continues, the layer of Ta(N) is impacted, disturbing the Ta(N) layer, releasing more N, and reforming the surface of the film. Thus, α-Ta is formed at the top surface layer of the film. The re-formed surface layer may not be strictly stratified as described, but may comprise a film with diminishing nitrogen content from a bottom to a top surface of the film. Further, the re-formed surface layer may have a lattice mismatch of less than 5% with the underlying surface. The bombarded sub-layer of the nitrogen containing compound may be of a thickness between about 75 and 85 Å thick. Bombarding element 406 may be delivered in a plasma system or an implant system. Bombarding element 406 reorganizes about 10-90 Å of the TaN layer to form a layer of Ta(N) and α-Ta of about 8-12 Å thick. The nitrogen 404, as well as bombarding element 406, may be out-gassed from the system.

Figure 5:
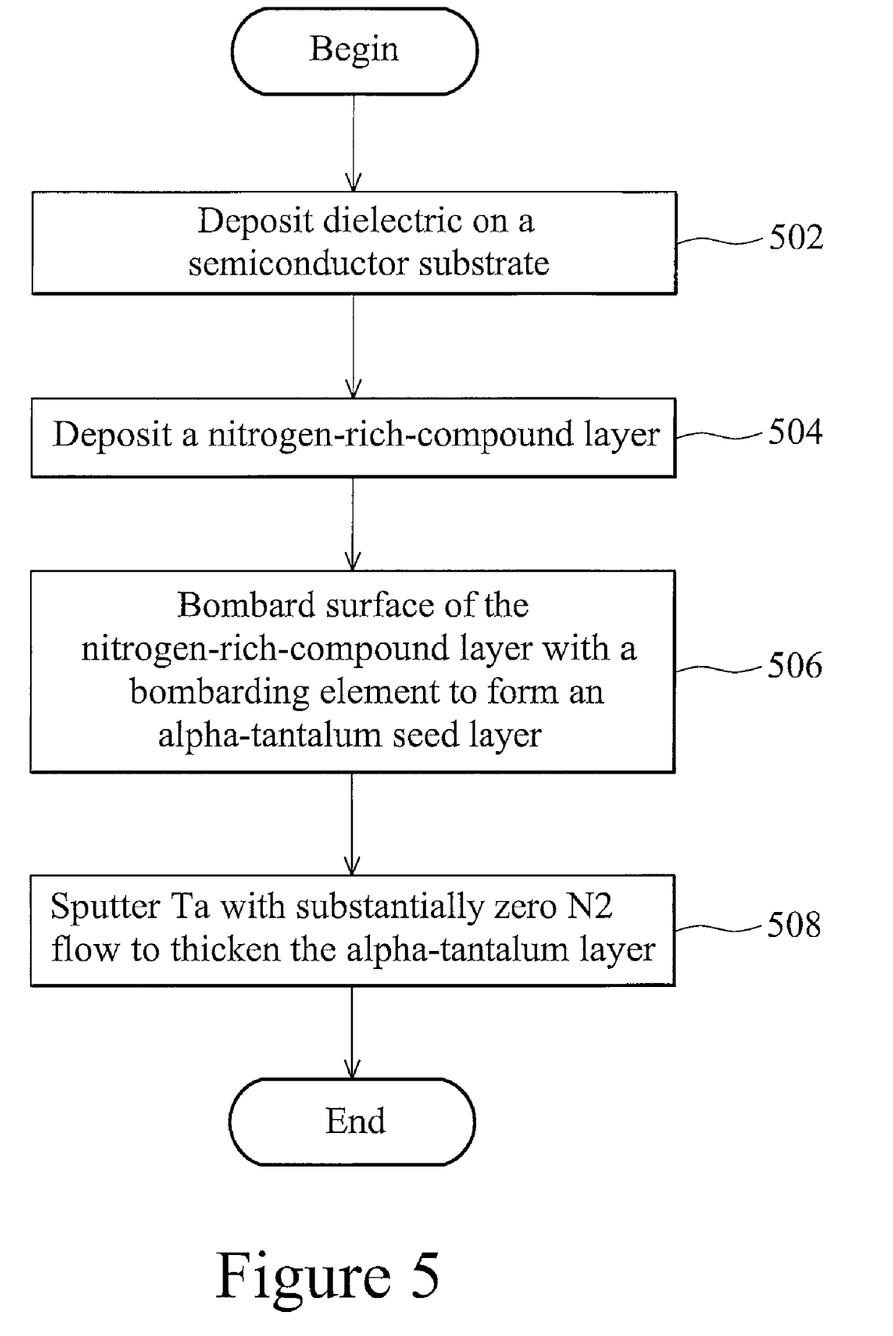
FIG. 5 is a flow chart illustrating the process of forming an $\alpha$-Ta layer, in accordance with an illustrative embodiment.

FIG. 5 is a flow chart illustrating the process of forming an α-Ta layer. The process begins with a deposition of a dielectric on a semiconductor substrate (step 502). The semiconductor substrate may or may not include an aluminum containing layer. For instance, an $Al_2O_3$ substrate is not part of the illustrative embodiments. However, if a MIM capacitor is being formed on a semiconductor device in an inter-metal dielectric, there may be within the scope of the illustrative embodiments an Al compound included within the circuitry of the underlying substrate, for instance, an AlCu layer may be included.

The dielectric layer may be deposited or formed, for example, of $SiO_2$, SiN or the like. A layer of a nitrogen containing compound is then deposited (step 504). The nitrogen containing compound may be TaN, SiN or the like. The layer of nitrogen-rich compound then undergoes a bombarding treatment, as illustrated in FIG. 4 (step 506). The plasma surface treatment on the nitrogen rich surface may be performed by a plasma reactor operated with RF power at 1200 W. The bombarding treatment re-forms a thin surface of α-Ta on the film, which provides a seed layer for a Ta sputter process. Finally, Ta is disposed on the film surface with substantially no $N_2$ flow during sputtering (step 508). Alpha-tantalum organizes in this layer based on the seed layer of α-Ta, as produced by the bombarding treatment, thus ending the formation of an α-Ta layer.

Figure 6:
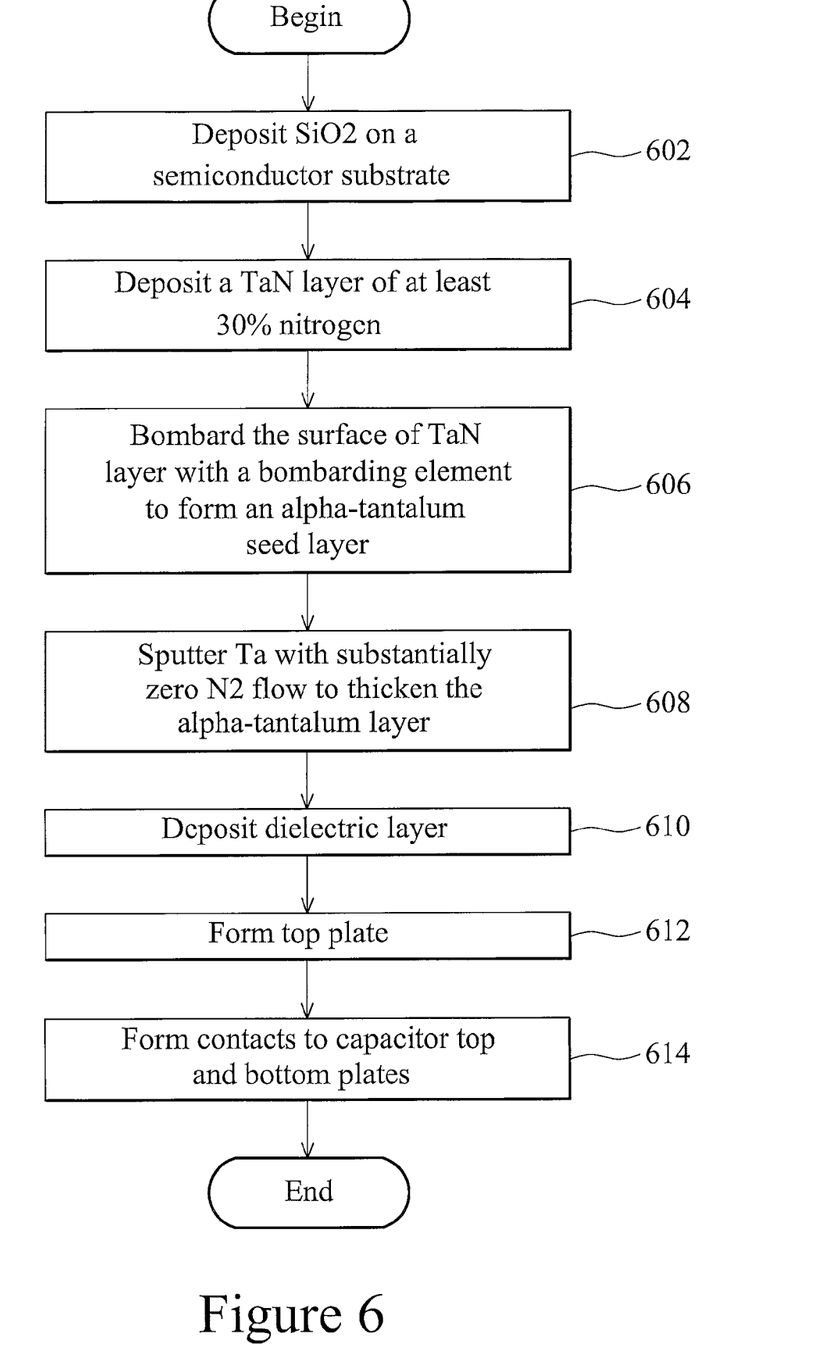
FIG. 6 is a flow chart illustrating the process of manufacturing a MIM structure by bombarding a nitrogen rich tantalum layer with a bombarding element to form an alpha-tantalum MIM capacitor plate.

Referencing now FIG. 6, in a further illustrative embodiment, the α-Ta layer formed in FIG. 5 is implemented as the bottom plate of a MIM capacitor. FIG. 6 illustrates the process of forming a MIM capacitor using the process of FIG. 5 as the bottom plate. The MIM capacitor process is accomplished by disposing a $SiO_2$ layer on a semiconductor substrate (step 602). A TaN layer of at least 30% nitrogen is disposed on the $SiO_2$ layer (step 604). The TaN layer is bombarded with a bombarding element to form an alpha-tantalum seed layer (step 606).

Ta is sputtered onto the seed layer, thereby thickening the α-Ta layer (step 608). Thus, the bottom plate of the MIM capacitor is formed. Ta and TaN may be deposited by a Novellus iNOVA system. Ta may be deposited at room temperature with DC power of 2000 W.

A dielectric layer is formed on the bottom plate (step 610). The dielectric layer may be a $SiO_2$ layer. The deposition may be performed using, for example, a Novellus Sequel system. The dielectric layer may also be undoped-silicon-glass (USG) composite films. The USG films may be prepared using, for example, such process parameters as: radio frequency (RF) (13.56 MHz) PECVD with silane ($SiH_4$, CVD precursor) carried in vapor phase by inert $N_2$ gas to the reaction chamber. The $SiH_4$ precursor gas may be mixed with nitrous oxygen (N$_2$O) in the deposition process. The chamber pressure and RF power may be maintained at 2.4 Torr and 500 Watts, respectively, throughout the deposition process. The deposition temperature may be about 400° C. and N$_2$O/SiH$_4$ flow ratio may be about 60, for example. A top plate is formed on the dielectric layer (step 612). The top plate may comprise β-Ta. Contacts to capacitor top and bottom plates (step 614). Note that methods and techniques that invert the capacitor or orient the capacitor vertically with respect to the substrate are within the scope of this invention.

Figure 7:
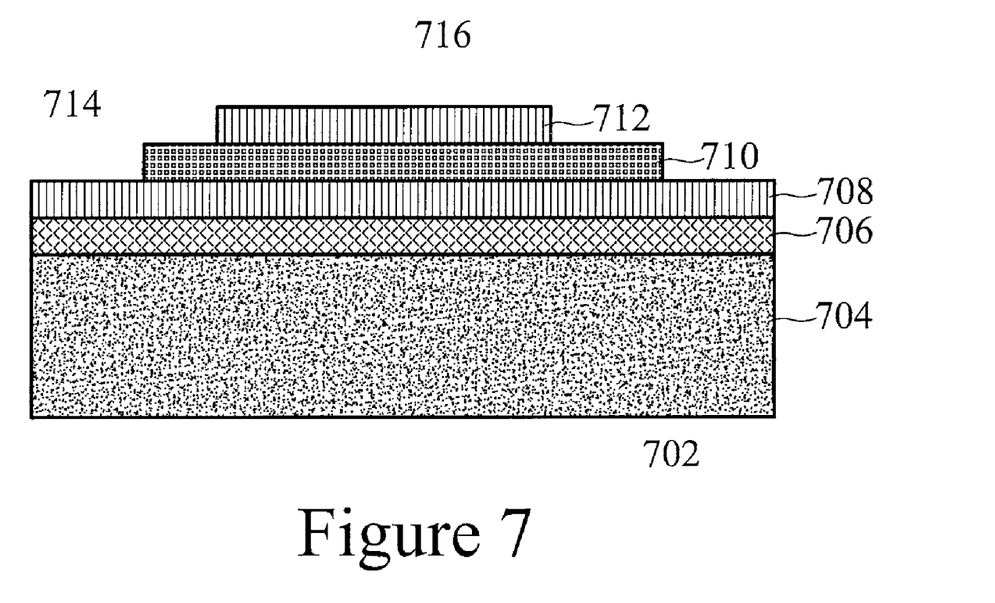
FIG. 7 is a cross-sectional view of a MIM structure incorporating an $\alpha$-Ta layer into a bottom plate of a MIM capacitor.

FIG. 7 is a cross-sectional view of the MIM capacitor with a bottom plate of an α-Ta layer as described in FIG. 6. Semiconductor substrate 702 is provided. Substrate 702 may comprise silicon or other semiconductor material, such as silicon on insulator (SOI). Compound semiconductors, GaAs, InP, Si/Ge, or SiC, as examples, may be used in place of silicon. Substrate 702 may also include other active components or circuits formed in the front end of line (FEOL), not shown. A SiO$_2$ layer 704 is disposed on substrate 702. A TaN$_x$ layer 706 is disposed on the SiO$_2$ layer 704. The TaN$_x$ layer undergoes a bombarding treatment, forming the seed layer for the disposing of a Ta layer with zero N$_2$ flow. An α-Ta layer 708 is then disposed. The Ta disposed crystallizes in the α-Ta phase because of the α-Ta seed layer formed by the bombarding treatment. A dielectric layer 710 is then disposed. The dielectric may be a high-κ dielectric layer. High-κ refers to the dielectric constant (κ) of the layer. Dielectrics with dielectric constants greater than the dielectric constant of SiO$_2$ (3.9) are termed high-κ. The dielectric layer 710 may be, for example, hafnium oxide, HfO$_2$. Other high-κ materials, for example, HfSiO$_x$ or various combinations of layers may be used within the scope of this embodiment. Further, the dielectric layer may be a composite high-κ stack and comprise, for example, HfO$_2$, HfSiO$_x$, or other layers or combinations of layers. Still further, the dielectric may not be high-κ and may comprise, for example, SiO$_2$, SiN, or combinations of layers.

The top plate of the MIM capacitor 712 may be a TaN film or other appropriate conductive layer. Contact to the bottom plate may be made in region 714 and contact to the top plate may be made in region 716.

Although the present invention and its advantages have been described in detail, it should be understood that various changes, substitutions, and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an alpha-tantalum layer, the method comprising:
   disposing a nitrogen containing base layer on a semiconductor substrate;
   bombarding the nitrogen containing base layer with a bombarding element, thereby forming an alpha-tantalum seed layer having a lower nitrogen content than the nitrogen containing base layer; and
   sputtering a layer of tantalum on the alpha-tantalum seed layer, thereby forming a surface layer of substantially alpha-tantalum.

2. The method of claim 1 further comprising forming the nitrogen containing base layer from the group consisting essentially of a tantalum nitride compound, a silicon nitride compound, and combinations thereof.

3. The method of claim 1 further comprising forming the alpha-tantalum seed layer to a thickness of about 8-12 Å.

4. The method of claim 1, wherein a sheet resistance of the surface layer is about 20-40 μohms-cm.

5. The method of claim 1, wherein the bombarding element is selected from the group consisting essentially of ionized argon, ionized krypton, atomic argon, atomic krypton, molecular argon, molecular krypton, and combinations thereof.

6. The method of claim 1 further comprising sputtering the layer of tantalum to a thickness of about 200 Å.

7. A method for forming a MIM capacitor, the method comprising:
   forming a first plate comprising:
      disposing a nitrogen containing base layer with a first nitrogen content on a semiconductor substrate;
      bombarding the nitrogen containing base layer with a bombarding element to form an alpha-tantalum seed layer having a second nitrogen content, wherein the first nitrogen content is greater than the second nitrogen content; and
      forming a surface layer of substantially alpha-tantalum;
   forming a dielectric layer on the first plate; and
   forming a second plate on the dielectric layer.

8. The method of claim 7, wherein the first nitrogen content is 5 times greater than the second nitrogen content.

9. The method of claim 7, further comprising forming the nitrogen containing base layer at a thickness of about 75-85 Å.

10. The method of claim 7, wherein the alpha-tantalum seed layer is about 8-12 Å thick.

11. The method of claim 7 further comprising forming the first plate with a sheet resistance of about 20-40 μohms-cm.

12. The method of claim 7 further comprising forming the first plate at a width greater than 50,000 Å.

13. The method of claim 7, wherein the bombarding element is selected from the group consisting essentially of ionized argon, ionized krypton, atomic argon, atomic krypton, molecular argon, molecular krypton, and combinations thereof.

14. The method of claim 7 further comprising forming the second plate of essentially TaN.

15. A method for forming an alpha-tantalum layer, the method comprising:
   forming a nitrogen-containing base layer, the nitrogen-containing base layer having a first nitrogen content;
   converting an upper layer of the nitrogen-containing layer into a conductive seed layer, the conductive seed layer having a second nitrogen content, the second nitrogen content being lower than the first nitrogen content;
   forming a first conductive layer using the conductive seed layer;
   forming a dielectric layer over the first conductive layer; and
   forming a second conductive layer over the dielectric layer.

16. The method of claim 15, wherein the second nitrogen content is 5 times greater than the first nitrogen content.

17. The method of claim 15, wherein the seed layer comprises alpha-tantalum.

18. The method of claim 15, wherein the converting the upper layer of the nitrogen-containing layer into the conductive seed layer the seed layer is implemented through a bombarding process.

19. The method of claim 18, wherein the bombarding process uses a bombarding element selected from the group consisting essentially of ionized argon, ionized krypton, atomic argon, atomic krypton, molecular argon, molecular krypton, and combinations thereof.

20. The method of claim 15, wherein the second conductive layer comprises substantially tantalum nitride.

\* \* \* \* \*